United States Patent
Lu

(10) Patent No.: US 11,264,073 B2
(45) Date of Patent: Mar. 1, 2022

(54) DEVICE AND METHOD FOR PERFORMING MATRIX OPERATION

(71) Applicant: Taiwan Semiconductor Manufacturing Company, Ltd., Hsinchu (TW)

(72) Inventor: Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/085,361

(22) Filed: Oct. 30, 2020

(65) Prior Publication Data

US 2021/0193208 A1 Jun. 24, 2021

Related U.S. Application Data

(60) Provisional application No. 62/952,774, filed on Dec. 23, 2019.

(51) Int. Cl.
*G11C 11/22* (2006.01)
*G11C 7/10* (2006.01)

(52) U.S. Cl.
CPC ........ *G11C 11/2255* (2013.01); *G11C 7/1045* (2013.01); *G11C 7/1051* (2013.01); *G11C 7/1078* (2013.01); *G11C 11/2273* (2013.01); *G11C 11/2275* (2013.01); *G11C 11/2297* (2013.01)

(58) Field of Classification Search
CPC . G11C 11/2255; G11C 7/1045; G11C 7/1051; G11C 11/1078
See application file for complete search history.

(56) References Cited

U.S. PATENT DOCUMENTS

| | | | | |
|---|---|---|---|---|
| 5,909,387 | A * | 6/1999 | Wong | G11C 27/005 365/45 |
| 2002/0044478 | A1* | 4/2002 | Honigschmid | G11C 11/22 365/145 |
| 2006/0056225 | A1* | 3/2006 | Hashimoto | G11C 11/22 365/145 |
| 2012/0195094 | A1* | 8/2012 | Greco | G11C 11/22 365/145 |
| 2017/0140807 | A1* | 5/2017 | Sun | G11C 29/023 |
| 2020/0402563 | A1* | 12/2020 | Guo | G11C 11/2259 |

* cited by examiner

*Primary Examiner* — Han Yang
(74) *Attorney, Agent, or Firm* — Merchant & Gould P.C.

(57) ABSTRACT

A system for processing a data array, such as transposing a matrix, includes a two-dimensional array of memory cells, such as FeFETs, each having an input end, an output end and a control end. The system also includes an input interface is adapted to supply signals indicative of a subset of the data array, such as a row of a matrix, and output control signals to the input ends of a selected column of the memory cells. The system further includes an output interface adapted to receive the data stored in the memory array from the output ends of a selected row of the memory cells. A method of processing a data array, such as transposing a matrix, include writing subsets of the data array to the memory array column-by-column, and reading from the memory cells, row-by-row.

20 Claims, 8 Drawing Sheets

$$M = \begin{array}{c|ccc|ccc|} \cline{2-7} & a & b & c & d & e & f \\ m_1 & g & h & i & j & k & l & m_2 \\ & m & n & o & p & q & r \\ \cline{2-7} & s & t & u & v & w & x \\ m_3 & y & z & 0 & 1 & 2 & 3 & m_4 \\ & 4 & 5 & 6 & 7 & 8 & 9 \\ \cline{2-7} \end{array}$$

$$M^T = \begin{array}{c|ccc|ccc|} \cline{2-7} & a & g & m & s & y & 4 \\ m_1^T & b & h & n & t & z & 5 & m_3^T \\ & c & i & o & u & 0 & 6 \\ \cline{2-7} & d & j & p & v & 1 & 7 \\ m_2^T & e & k & q & w & 2 & 8 & m_4^T \\ & f & l & r & x & 3 & 9 \\ \cline{2-7} \end{array}$$

Figure 7

DEVICE AND METHOD FOR PERFORMING MATRIX OPERATION

CROSS-REFERENCE TO RELATED APPLICATION

The present application claims the benefit of U.S. Provisional Application No. 62/952,774, filed Dec. 23, 2019, which is incorporated herein by reference.

BACKGROUND

This disclosure relates generally to electronic devices and method for implementing matrix operations, such as transposition. This disclosure more specifically relates to a memory array and associated method for efficiently performing such matrix operations.

Computer-implemented matrix operations, such as transposition are used in many applications, including machine learning (e.g. gradient descent), image processing, signal modulation/demodulation, statistical programming, and social network (relationship) analysis. Efficient implementation of such matrix operations serves to accelerate many of these applications. Efforts are thus ongoing in improving devices and methods for matrix operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a process for a matrix operation in which the transposition of a matrix is accomplished by transposition of submatrices in accordance with some embodiments.

DETAILED DESCRIPTION

Figure 1:
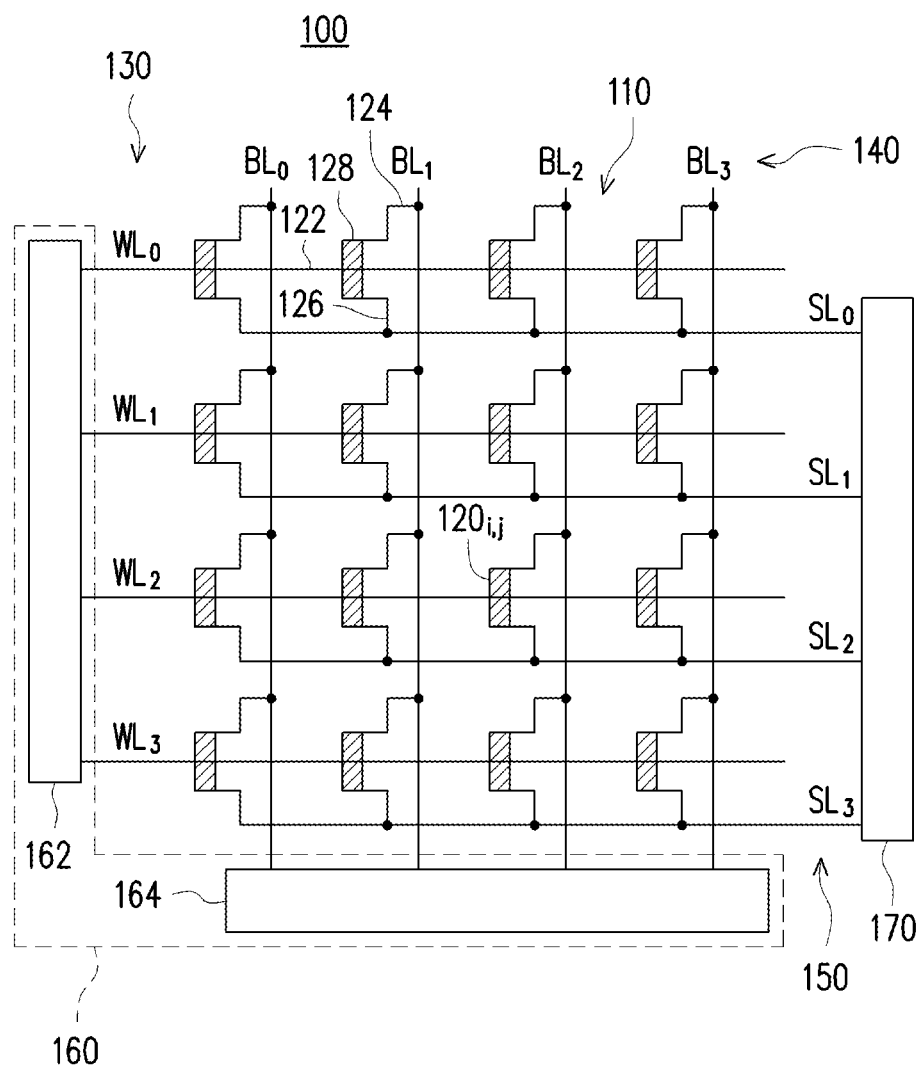
FIG. 1 is a schematic diagram illustrating an example of a system for implementing a matrix operation in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This disclosure relates to processing of multi-dimensional, e.g., two-dimensional (2D), data structure using memory arrays. An example of processing of a multi-dimensional data structure is matrix transposition, in which the rows and columns of a matrix are swapped. That is, the indices of the elements of the transpose, $A^T$, of a matrix A are reversed from those of the elements of the matrix A: $[A^T]_{ij}=[A]_{ji}$. Matrix transposition finds used in many applications. Examples of such applications include machine learning (e.g., gradient descent algorithms), image processing, signal modulation/demodulation, statistical programming, and relationship analysis in social network analysis.

For example, in machine learning, neural networks frequently process weights and inputs of different sizes where the dimensions (number of columns and/or rows) do not readily meet the requirements of matrix multiplication. Matrix transposition provides a way to "rotate" one of the matrices so that the operation complies with multiplication requirements and can thus continue. As another example in machine learning, backward cycle (or backward propagation) is used to adjusting the weights by looking at the difference between the prediction and the actual result. Backward cycle on a single layer also involves a vector-matrix multiplication on the transpose of the weight matrix: $z=W^T\delta$, where W is the weight matrix, the vector $\delta$ of length M represents the error calculated by the output neurons, and the vector z of length N is further processed using the derivative of neuron non-linearity and then passed down to the previous layers. Finally, in the update cycle the weight matrix W is updated by performing an outer product of the two vectors that are used in the forward and the backward cycles and usually expressed as $W \leftarrow W+\eta(\delta x^T)$ where x is the input vector, and $\eta$ is a global learning rate.

As further examples of applications of matrix transposition, image processing often entail transposing very large data matrices to re-orient data for display, to improve computational efficiency, or to rearrange data in forms useable by library functions. In signal processing, such as modulation and demodulation, Fast Fourier Transform (FFT) is one of the most important algorithms in mathematical, numerical, scientific, engineering, and technical applications. Some of the applications of FFT algorithm include telecommunication, time series and wave analysis, and convolution, solving linear differential equation, particle simulation, Poisson's equation solver and digital signal processing. Moreover, FFT is widely used in large-scale parallel simulations such as plasma simulation, weather forecasting, and dynamic fluids, where efficient parallel FFT computation is desirable. Matrix transposition is widely used in implementations of Fast Fourier Transforms (e.g., one-dimensional (1D) FFT, two-dimensional (2D) FFT, and three-dimensional (3D) FFT).

Computer implementations of matrix operations are often computation-intensive. Matrices are (2D) data structures while physical memory is typically designed as a linear (1D) structure. Matrix data stored in 1D structure are arranged either row-indexed (row-major order) or column indexed (column-major order). In a row-indexed storage scheme, the rows of a matrix are stored sequentially in a linear array in memory; in a column-indexed storage scheme, the columns of a matrix are stored sequentially in a linear array in memory. To perform transposition of a matrix of dimension N using traditional methods, each element of the matrix needs to be read N times; otherwise large temporary storage (registers) would be needed to be used to hold the matrix and select with index.

For example, a 4×4 array (matrix A) is stored in memory (16-element M vector) in a row-indexed order as: A[0,0] in M[0]; A[0,1] in M[1]; A[0,2] in M[2]; A[0,3] in M[3]; A[1,0] in M[4]; A[1,1] in M[5]; A[1,2] in M[6]; A[1,3] in M[7]; A[2,0] in M[8]; A[2,1] in M[9]; A[2,2] in M[10]; A[2,3] in M[11]; A[3,0] in M[12]; A[3,1] in M[13]; A[3,2] in M[14]; and A[3,3] in M[15]. To transpose A with a traditional method, first, all elements of M, i.e., M[0] through M[15] are read. Next, the elements in the M vector are indexed such that every fourth element is to be stored consecutively. Finally, a new 16-element vector M' is written with elements M'[0]=M[0], M'[1]=M[4], M'[2]=M[8], M'[3]=M[12], M'[4]=M[1], M'[5]=M[5] ... M'[i+4j]=M[4*i+j], M'[15]=M[15], where i runs from 0 to 3 for each j, and j runs from 0 to 3. The new vector M' represents the transposed matrix, $A^T$, and would require an additional amount of memory to store that is the same amount of memory to store the original matrix, A. Alternatively, matrix A can be transposed "in-place" by rearranging the elements of the vector M without significant amount of additional memory, at the cost of repeatedly reading and writing each element from and to memory.

Certain embodiments disclosed in the present disclosure achieves transposition of matrices without either requiring any, or substantial amount of, additional memory or read/write operations to rearrange matrix elements stored in memory.

According to some embodiments, a memory array that can be written in columns and read in rows, or vice versa, is provided and used to perform matrix transposition. A particular circuit structure of ferroelectric transistor memory can be used to the requirement of transposing a 2D array in accordance with some embodiments. Ferroelectric transistor memory (as opposed to ferroelectric capacitor memory) can be designed in a way that data is written in column form and read in row form (or vice versa). Ferroelectric memory circuit is designed with bit-line (BL), word-line (WL) and select-line (SL). By setting BL, WL and SL in a particular way one can write in column from and read in row form.

Ferroelectric transistor memory (FeRAM) is a nonvolatile memory supporting a circuit design that allows writing data in column form and reading data in row form. Such circuit architecture can be used to transpose matrices efficiently. Multiple FeRAM arrays can be employed to allow storage of data in one-direction and read from them in the other direction. This method automatically transposes a matrix through writing and reading. No extra indexing or re-ordering is needed.

More specifically, in some embodiments, the BLs and SLs are associated with memory cells arranged in different directions. For example, each BL is connected to a respective column of memory cells, whereas each SL is connected to a respective row of memory cells. Such a configuration, as described in more detail for example systems below, enables the matrix elements to be applied to the WLs and stored in the memory cells column-by-column as selected by the BLs, and read from the memory cells row-by-row as selected by the SLs. The connections of the columns and rows of memory cell to WL, BL and SL, as well as the write/read scheme facilitated by such connections are contrasted with those of conventional memory arrays. With conventional memory arrays, BLs and SLs are associated with memory cells arranged in the same direction, e.g., both BLs and SLs are connected to same respective columns of memory cells. A WL is typically used to enable a selected row to be written to; and the written date are read from selected row. With certain embodiments disclosed herein, however, WLs supply input data to be written to a column selected by the combination of signals on the BLs and SLs; data is subsequently read on the BLs from each row selected by a combination of SLs and WLs. Because the matrix elements are written to the two-dimensional memory array in columns but read in rows, the matrix read is already rotated, columns-for-rows, from the matrix written. Transposition of matrix is thus accomplished by the write and read operations themselves, carried out in the appropriate order, without any additional processing of data.

In some embodiments, a system for processing a data set representing an input data array having one or more one-dimensional data arrays, each having a set of elements, includes a memory array having memory cells arranged logically (and in some embodiment physically as well) in rows and columns. Each memory cell can be a non-volatile memory cell, such as a ferroelectric random-access memory (FeRAM) cell, such as a ferroelectric field-effect transistor (FeFET), and have an input end, an output end, and a control end. The system further includes input lines, each connected to the input ends of a row of the memory cells. The system further includes output lines, each connected to the output ends of a column of the memory cells. The system further includes select lines, each connected to the control ends of a row of the memory cells. The system further includes an input interface connected to the input lines and adapted to supply the elements of one of the one-dimensional data arrays to the respective input lines and to supply output control signals to the input lines. The system further includes an output interface connected to the output lines and adapted to receive from the output lines the elements stored in respective columns of the memory cells and to supply an input control signals to the output lines. Each of the memory cells is adapted to store the element supplied by the input interface to the respective input line given a certain combination of the states of the output line and select line connected to the memory cell; each of the memory cells is further adapted to output the stored element to the respective output line given a certain combination of the states of the input line and select line connected to the memory cell.

In certain embodiments, the input interface can be adapted to supply control signal to the input lines such that the input lines function as traditional word lines, and the output interface can be adapted to both receive data stored in the memory cells and output date to the memory cells such that the input lines function as traditional bit lines. This way, the system can be configured to service both as a traditional memory system and a system for matrix processing, such as matrix transposition.

In certain embodiments, a system for transposing a matrix having elements arranged in rows and columns includes a memory array having memory cells arranged logically (and in some embodiment physically as well) in rows and columns. Each memory cell includes an FeFET, which has a gate, a source and a drain, and a ferroelectric gate insulation layer separating the gate one side and the source and drain on the other side. The system further includes word lines, each connected to the gates of a row of the memory cells. The system further includes bit lines, each connected to the sources (or drains) of a column of the memory cells. The system further includes select lines, each connected to the drains (or sources) of a row of the memory cells. The system further includes an input interface connected to the word lines and adapted to supply the elements of a row (or column) of the matrix to the respective word lines to store the elements in a column of the memory cells, and to supply output control signals to the word lines. The system further includes an output interface connected to the bit lines and adapted to receive from the bit lines the elements of a row of the memory cells, and to supply an input control signals to the output lines.

In some embodiments, a method of transposing a matrix having elements arranged in row and columns includes writing each of the rows of elements to a respective column of memory cells in a group of memory cells arranged in rows and columns. The method further includes reading from each of the rows of memory cells. Such a method can be used for row-indexed storage of matrices. Alternatively, a method of transposing a matrix having elements arranged in row and columns includes writing each of the columns of elements to a respective column of memory cells in a group of memory cells arranged in rows and columns. The method further includes reading from each of the rows of memory cells. Such a method can be used for column-indexed storage of matrices.

As a specific example, a system (100) for transposing matrices of dimensions up to 4×4 is illustrated in FIG. 1. In this example, the system includes a memory array (110), which includes memory elements ($120_{i,j}$, where i=0, 1, 2 or 3, and j=0, 1, 2 or 3) physically arranged, and accessible, in rows ($120_i$) and columns ($120_j$). Each memory cell ($120_{i,j}$) in some embodiments is a non-volatile memory cell, such as a ferroelectric random-access memory (FeRAM) cell. In the specific embodiment shown in FIG. 1, the memory cell is a ferroelectric field-effect transistor (FeFET). Each FeFET has a gate (122) as an input end, a drain (124) as an output end, and a source (126) as a control end. The gate insulating layer (128) separating the gate (122) from the drain (124) and source (126) in each FeFET in this example is made of a ferroelectric material. Examples of suitable ferroelectric materials include hafnium oxide and hafnium zirconium oxide, but other ferroelectric materials can be used as well.

The system (100) in this example further includes a set of word lines (WLs) (130), each ($WL_i$) connected to the gates (122) of a respective row ($120_i$) of memory cells. The system (100) in this example also includes a set of bit lines (BLs) (140), each ($BL_j$) connected to the drain (124) of a respective column ($120_j$) of memory cells. The system (100) in this example further includes a set of select lines (SLs) (150), each ($SL_i$) connected to the sources (126) of a respective row ($120_i$) of memory cells.

The system (100) in this example further includes an input/output (I/O) interface (160), which includes an input interface (162) and an output interface (164). The input interface (162) includes drivers (not shown) in some embodiments and is adapted to supply, row-by-row for row-indexed matrix storage, or column-by-column for column-indexed matrix storage, elements of a matrix to the respective WLs (130). The output interface (164) includes sense amplifiers (not shown) in some embodiments and is adapted to receive from the BLs (140) elements stored in selected memory elements ($120_{i,j}$). The output interface (164) can further include drivers (not shown) for applying voltages to respective BLs to select the respectively columns of memory cells for writing to the columns of memory cells. The system (100) in this example further includes a select signal interface (170), which includes drivers (not shown) and is adapted to supply selection signals to the SLs. As described in more detail below, the input interface (162) is also adapted to supply output control signals to the WLs (130); the output control signals and selection signals determine the row of memory cells from which matrix elements are read to the output interface (164) via the BLs (140) in some embodiments. The output interface (164) is also adapted to supply input control signals to the BLs (140); the input control signals and selection signals determine the column of memory cells to which matrix elements are written from the output interface (160) via the WLs (130) in some embodiments.

In some embodiments, the output interface (164) is further configured as an input/output (I/O) interface, adapted to supply data to, and receive data from, the BLs (140). The input interface (162) is further adapted to supply enable signals to the WLs to enable read and write operations of respective rows ($120_i$) of memory cells. In such embodiments, the memory array (110) can be used for matrix operation (input from WLs; output to BLs) as well as conventional data storage (I/O through BLs when enabled by WLs).

Figure 2:
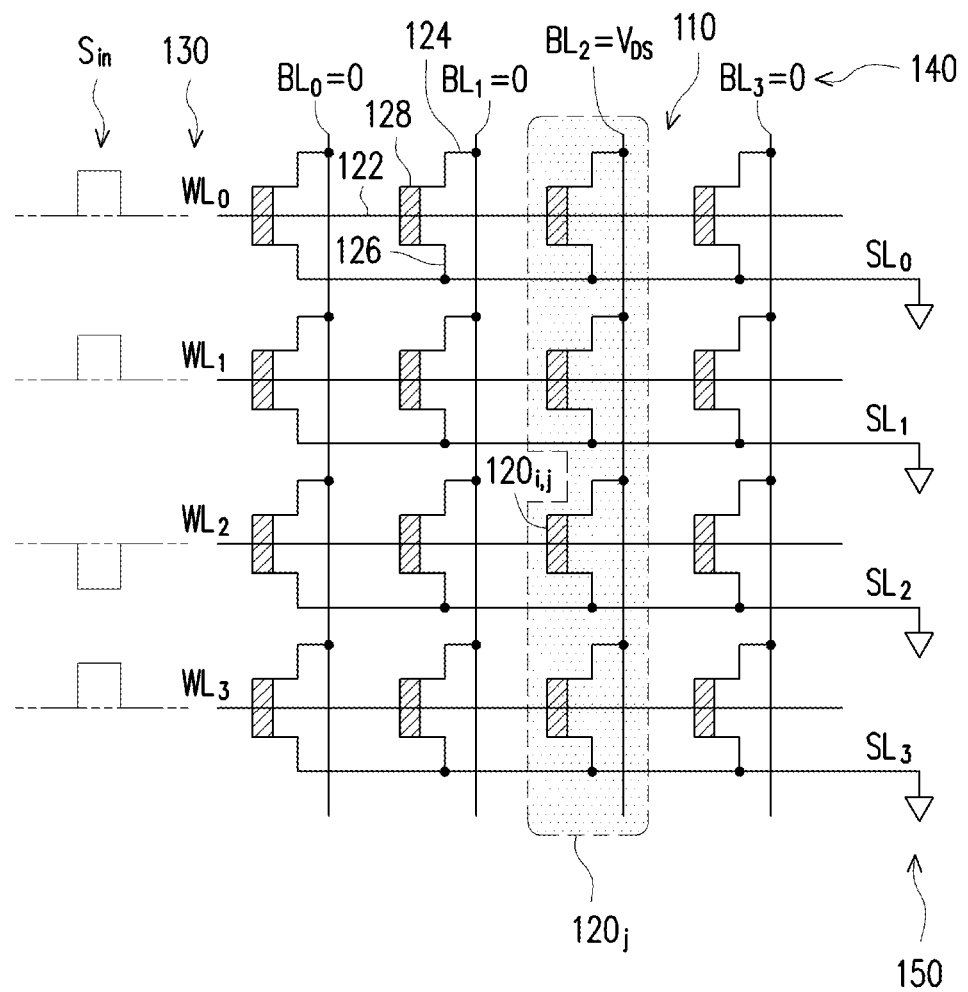
FIG. 2 illustrates writing to a column of memory cells in the two-dimensional array of memory cells in the system illustrated in FIG. 1 in a matrix transposition operation in accordance with some embodiments.
Figure 3A:
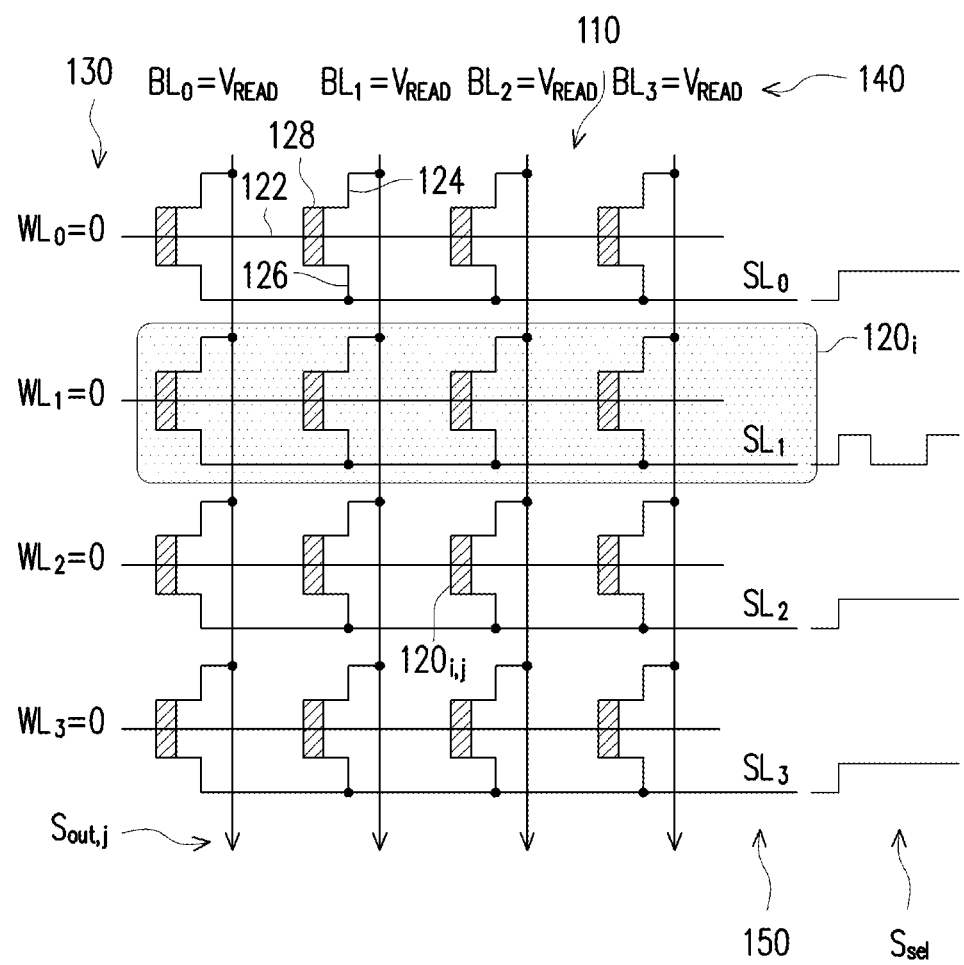
FIG. 3A illustrates reading from a row of memory cells in the system illustrated in FIG. 1 in a matrix transposition operation following writing to the columns of memory cells in the two-dimensional array of memory cells in accordance with some embodiments.
Figures 3B, 3C:
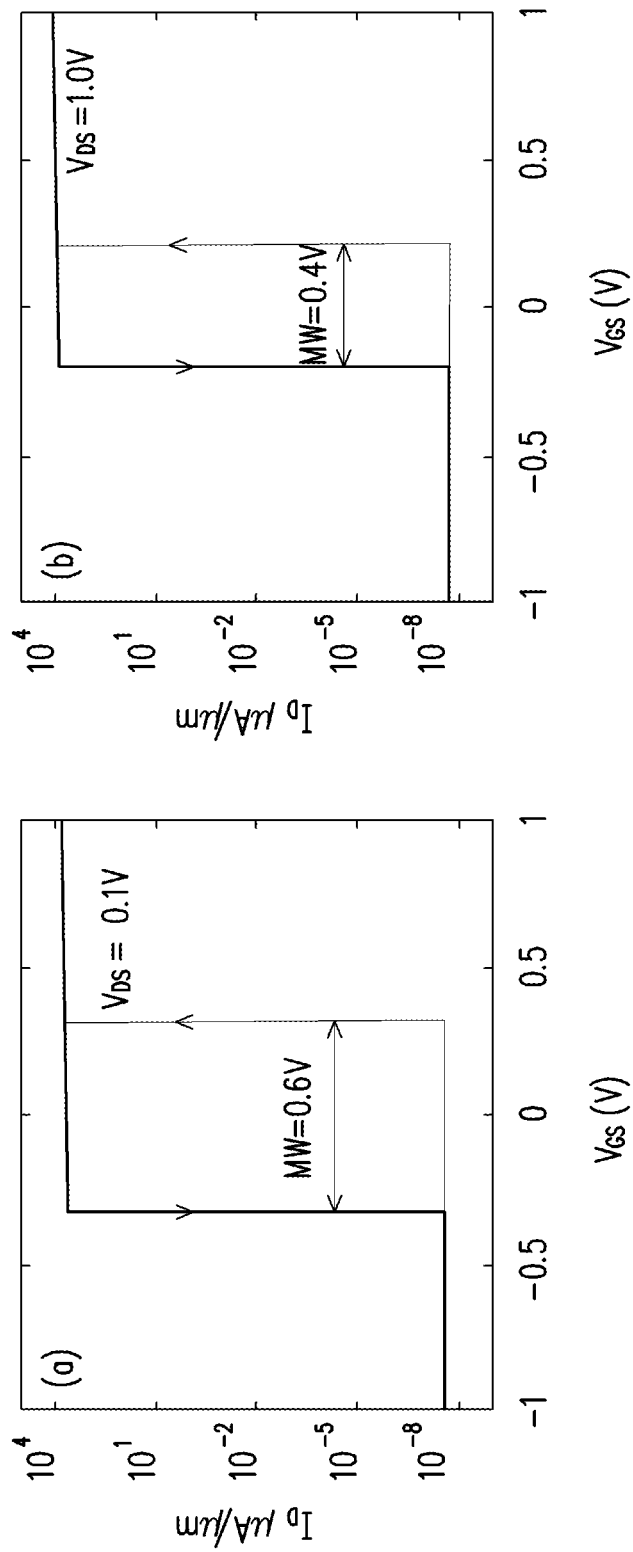
FIG. 3B illustrate the drain current ($I_D$) as a function of gate-source voltage ($V_{GS}$) at a given drain-source voltage ($V_{DS}$) for FeFET memory cells used in the memory cell array in accordance with some embodiments.
FIG. 3C illustrate the drain current ($I_D$) as a function of gate-source voltage ($V_{GS}$) at a higher drain-source voltage ($V_{DS}$) than that in FIG. 3B for FeFET memory cells used in the memory cell array in accordance with some embodiments.

An example operation of the system (100) in transposing a matrix in accordance with some embodiments is now described with reference to FIGS. 2 and 3A-C. In the examples shown, in a WRITE operation, an input array of binary signals, such as "1, 1, 0, 1" is applied to the WLs and written to a column (e.g., Column-2) selected by the BL (e.g., $BL_2$) for of that column. The writing process can be repeated for other input arrays, written to other selected columns. In a READ operation, an SL (e.g., $SL_1$) for a row (e.g., Row-1) is used to select the respective row to be read from, and the stored data in the selected row are transmitted via the BLs. As shown in FIG. 2, in a write operation, all SLs are set to ground (0 volts) by the select signal interface (170). The BL for the column of memory cells ($120_{i,j}$) selected to be written to is set to a voltage $V_{DS}$ (e.g., 1.0 V or another suitable voltage) by the output interface (164); the remaining BLs are set to 0 volts. In the example illustrated in FIG. 2, the third column (j=2) is selected. The WLs are pulsed with voltages $S_{in}$ indicative of the numbers in the corresponding row (for row-indexed storage) or column (for column-index storage) of the matrix to be transposed. In this example, a binary "1" is represented by a positive voltage pulse, and a binary "0" is represented by a negative voltage pulse. The magnitude of the voltage pulse, $|V_{GS}|$, is greater than the switching voltage. In some embodiments, voltages satisfying $0.2V<|V_{GS}|<0.3V$ are used, but other magnitudes can be used. Thus, in the example shown in FIG. 2, a third row or column of matrix, with elements 1, 1, 0 and 1 is written to the third column of memory cells ($120_{i,2}$). With each column of memory cells selected in turn (j=0, 1, 2 and 3), each row or column of the matrix is written to a respective column, with a "1" stored as a low source-drain resistance and "0" as a high source-drain resistance.

To read the elements from the memory array (110), all WLs are set to 0 V; all BLs are set to a read voltage $V_{read}$; and all SLs are initially set to $V_{read}$. Thereafter, the SL for the row of memory cells to be read (in this example the second row (i=1)) is set to 0 V. The output signal, $S_{out,j}$, for each SL is indicative of the element stored in the respective memory cell in the selected row: a stored "1" is represented by a high discharge current in the BL, and "0" by a low discharge current. With each row of memory cells selected in turn (i=0, 1, 2 and 3), each column (for row-indexed storage) or row (for column-indexed storage) of the matrix is read.

In some embodiments, $V_{read}$ is chosen at least in part to optimize the read margin, i.e., to enhance the distinction between a "0" and "1" stored in a given memory cell. As shown in the drain current ($I_D$) vs. gate-source voltage ($V_{GS}$) plots for different drain-source voltages ($V_{DS}$) in FIGS. 3B and 3C, the "memory window" (MW), i.e., the width of the hysteresis curve of an FeFET depends on the $V_{DS}$ applied: a higher $V_{DS}$ results in a smaller MW. In the example in FIG. 3B, MW=0.6V for $V_{DS}$=0.1V; in the example in FIG. 3C, MW=0.4V for $V_{DS}$=1.0V. Thus, for example, if a $V_{read}$<0.2V is used, $V_{DS}$<0.2V, and $V_{GS}$<0.2V. This ensures that the $V_{GS}$ in the read cycle does not exceed the switching voltage of the FeFET if $V_{DS}$ of up to 1.0V was used in the write cycle. This ensures that the memory state of the memory cell being read does not change.

Figure 4:
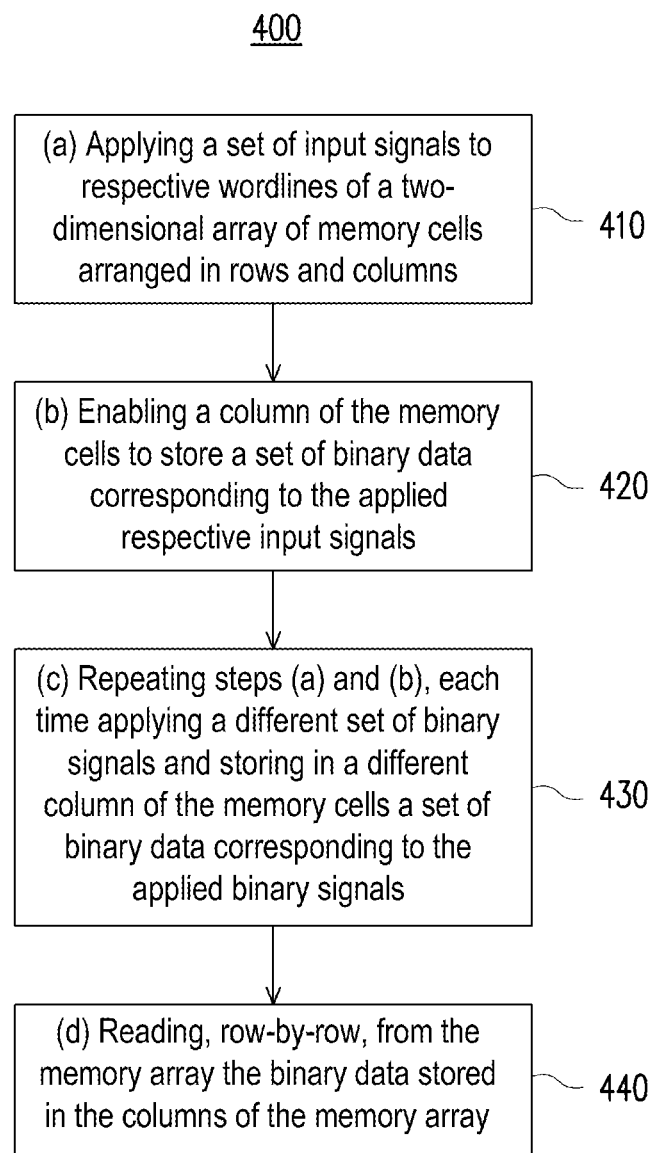
FIG. 4 illustrates an example of a system for implementing a multi-bit matrix operation in accordance with some embodiments.

In sum, as outlined in FIG. 4, a method (400) for processing (such as transposing a matrix) a data set representing an input data array (such as a matrix) having one or more one-dimensional data arrays (such as rows or columns of a matrix), each having a set of elements (such as the elements in a row or column of a matrix) using an a array of memory cells accessible in rows and columns includes (a) applying (410) a set of input signals to respective wordlines of a two-dimensional array of memory cells arranged in rows and columns; (b) enabling (420) a column of the memory cells to store a set of binary data corresponding to the applied respective input signals; (c) repeating (430) steps (a) and (b), each time applying a different set of input signals and storing in a different column of the memory cells a set of binary data corresponding to the applied input signals; and (d) reading (440), row-by-row, from the memory array the binary data written to the columns of the memory array.

Figure 5:
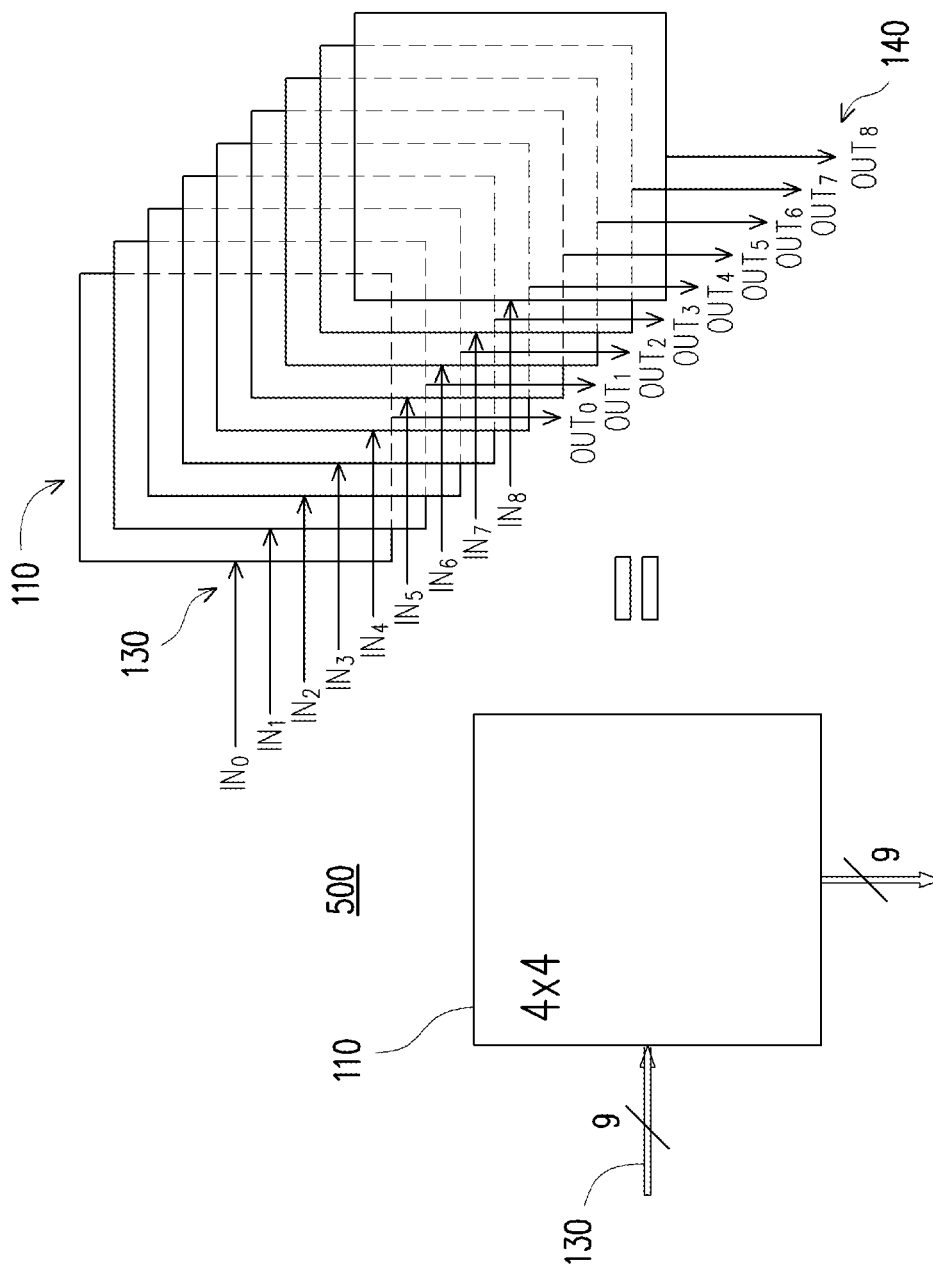
FIG. 5 outlines a process for a matrix operation in accordance with some embodiments.

In some embodiments, as illustrated in FIG. 5, multiple memory arrays (110) shown in FIG. 1 can be used together to process matrices with multi-bit elements. In the example shown in FIG. 5, the system (500) includes nine 4×4 memory cell arrays (110), nine respective sets WLs (130) and nine respective sets BLs (140), as well as respective sets of SLs and respective I/O interfaces (not shown in FIG. 5). A matrix of nine-bit elements can be represented by nine matrices of one-bit elements, with each of the nine matrices holding the bits of the same place value (for example, all elements of place value of $2^5$ are in one matrix and all elements of place value of $2^8$ are in another matrix). Each of the one-bit matrices is transposed using a respective memory cell array (110). The resulting outputs (140) thus are multi-bit elements of the transposed matrix.

Figure 6:
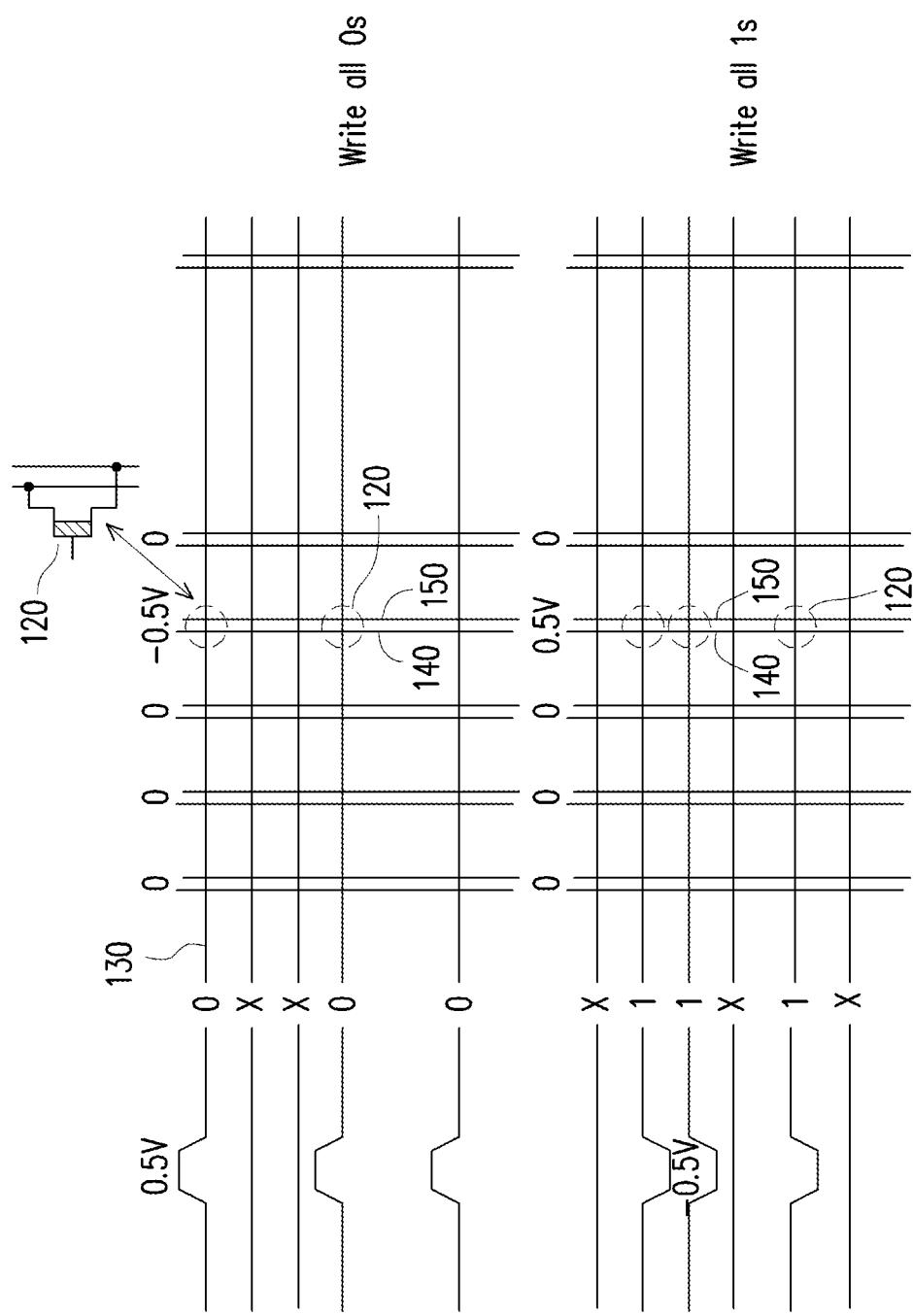
FIG. 6 illustrates two-phase writing of matrix elements in accordance with some embodiments.

In some embodiments, writing operations can be accomplished using other combinations of biasing of WL, BL and SL than described in the above examples. For example, writing a value can be accomplished by a combination of biasing of WL, BL and SL such that the gate-to-source voltage ($V_{GS}$) has an absolute value greater than a threshold level, such as 1.0 V, i.e., $|V_{GS}| \geq 1.0$ V. For example, as illustrated with the simplified diagram in FIG. 6, writing a "0" can be accomplished by biasing BL and SL at 0.5 V for the column to be written, and WL at −0.5 V; writing a "1" can be accomplished by biasing BL and SL at −0.5 V for the column to be written, and WL at 0.5 V. Furthermore, in some embodiments, such as the example illustrated in FIG. 6, each column can be written in two phases, with all "0"s written in one phase and all "1"s written in the other phase. In the example showing in FIG. 6, "0" are written first, but the reverse order can be use as well.

In some embodiments, matrix operations can be carried out by dividing a matrix into submatrices and performing matrix operations, such as transposition, on each submatrix as described above. For example, as illustrated in FIG. 7, a matrix, M, to be transposed can be divided into multiple submatrices $M_i$, i=1, 2, 3, . . . In the specific examples shown in FIG. 7, a 6×6 matrix, M, is divided into four 3×3 submatrices, $M_1$, $M_2$, $M_3$, and $M_4$. Each submatrix, $M_i$, can be transposed to a submatrix, $M_i^T$, using a 3×3 FeFET array as described above. The resultant matrix, $M^T$, is compose of transposed submatrices, $M_i^T$, i=1, 2, 3, 4.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A system for processing a data set representing an input data array having one or more one-dimensional data arrays, each having a set of elements, the system comprising:
    a memory array having a plurality of memory cells arranged logically in rows and columns, each of the plurality of memory cells having an input end, an output end, and a control end;
    a plurality of input lines, each connected to the input ends of a respective row of the memory cells;
    a plurality of output lines, each connected to the output ends of a respective column of the memory cells;
    a plurality select lines, each connected to the control ends of a respective row of the memory cells; and
    an input interface connected to the plurality of input lines and adapted to supply the elements of one of the one-dimensional data arrays to the respective input lines;
    an output interface connected to the plurality of output lines and adapted to receive from the output lines the elements stored in respective columns of the memory cells; and
    a selection signal interface connected to the plurality of select lines and adapted to supply selection signals to the select lines,
    wherein the output interface or selection signal interface, or both cooperatively, are adapted to select columns of the plurality of memory cells to enable, column-by-column, the plurality of memory cells to store the elements supplied by the input interface.

2. The system of claim 1,
    wherein the input interface or selection signal interface, or both cooperatively, are adapted to select a-rows of the plurality of memory cells to enable, row-by-row, the plurality of memory cells to output the elements stored in the plurality of memory cells to the output interface.

3. The system of claim 1, wherein each of the memory cells comprises a ferro-electric random-access memory (Fe-RAM) cell.

4. The system of claim 1, wherein each of the memory cells comprise a ferro-electric field-effect transistor (FeFET) having a gate, a drain and a source, the gate being connected to the input line associated with the row to which the FeFET belongs, the drain connected to the output line associated with the column to which the FeFET belongs, and the source connected to the select line associated with the row to which the FeFET belongs.

5. The system of claim 1, wherein the input interface is further adapted to supply output control signals to the input lines, each of the plurality of memory cells being adapted to be enabled or disabled to output the element stored in the memory cell to the respective output line depending on a combination of the output control signal and selection signal applied to the memory cell.

6. The system of claim 5, wherein the output interface is further adapted to supply input control signals to the output lines, each of the plurality of memory cells being adapted to be enabled or disabled to store the element supplied by the input interface through the respective input line depending on a combination of the input control signal and selection signal applied to the memory cell.

7. The system of claim 6, wherein the input interface is adapted to supply the elements of a row of a matrix to the respective input lines.

8. The system of claim 1, wherein the selection signal interface is adapted to supply a voltage of a first level to all of the selection lines, and the output interface is adapted to supply a voltage of a second level to one of the output lines and a voltage of the first level to the remaining output lines,
wherein the memory elements in the memory array are adapted to be able to store the elements supplied by the input interface through the respective input lines when a voltage of the first level is applied to the control end and a voltage of the second level is applied to the output end,
wherein the memory elements in the memory array are adapted to be unable to store the elements supplied by the input interface through the respective input lines when a voltage of the first level is applied to both the control end and the output end.

9. The system of claim 8, wherein the input interface is adapted to supply a voltage of a first level to all of the input lines, and the selection signal interface is adapted to supply a voltage of the first level to one of the selection lines and a voltage of a second level to the remaining selection lines,
wherein the memory elements in the memory array are adapted to be able to output the elements stored in the respective memory elements to the output interface through the respective output lines when a voltage of the first level is applied to both the input end and the control end,
wherein the memory elements in the memory array are adapted to be unable to output the elements stored in the respective memory elements to the output interface through the respective output lines when a voltage of the first level is applied to the input end and a voltage of the second level is applied to the control end.

10. The system of claim 4, wherein the FeFET has a gate as the input end, a drain as the output end and a source as the control end, and the FeFET has a positive switching voltage and a negative switching voltage and is adapted to be switched on when a gate-source voltage exceeds the positive switch voltage and switched off when the gate-source voltage falls below the positive switch voltage, wherein the input interface is adapted to supply a positive voltage and a negative voltage to each of the input lines, the positive voltage being greater than the positive switching voltage and the negative voltage being lower than the negative switching voltage.

11. The system of claim 10, wherein the input interface is further adapted to supply a reference voltage different from the positive and negative voltages to each of the input lines.

12. A system for processing an input data array having one or more one-dimensional data arrays, each having a set of multi-bit elements, the system comprising:
a plurality of single-bit array processing systems, each comprising;
a memory array having a plurality of memory cells arranged logically in rows and columns, each of the plurality of memory cells having an input end, an output end, and a control end;
a plurality of input lines, each connected to the input ends of a respective row of the memory cells;
a plurality of output lines, each connected to the output ends of a respective column of the memory cells; and
a plurality select lines, each connected to the control ends of a respective row of the memory cells;
an input interface connected to the plurality of input lines of the plurality of single-bit array processing systems and adapted to supply a bit of each of the multi-bit elements of one of the one-dimensional data arrays to each of the respective input lines;
an output interface connected to the plurality of output lines of each single-bit array processing system and adapted to receive from the output lines the elements stored in respective columns of the memory cells; and
a selection signal interface connected to the plurality of select lines of each single-bit processing system and adapted to supply selection signals to the select lines;
wherein the output interface and selection signal interface are adapted to select columns of the plurality of memory cells in each of the plurality of single-bit array processing systems to enable, column-by-column, the plurality of memory cells to store the elements supplied by the input interface;
wherein the input interface and selection signal interface are adapted to select rows of the plurality of memory cells in each of the plurality of single-bit array processing systems to enable, row-by-row, the plurality of memory cells to output the elements stored in of the plurality of memory cells to the output interface.

13. The system of claim 12, wherein each of the memory cells in each of the single bit processing system comprises a ferro-electric field-effect transistor (FeFET).

14. The system of claim 12, wherein each bit of each of the multi-bit elements has a place value, wherein the input interface is adapted to supply the bits having the same place value from the plurality of multi-bit elements to the input lines of a respective one of the single-bit processing systems.

15. The system of claim 14, wherein the output interface is adapted to form an output array of multi-bit elements by grouping the outputs from the single-bit processing systems.

16. A method of implementing a matrix operation, the method comprising:
sequentially applying a plurality of sets of input signals, each set indicative of a respective column or row of values of elements of a matrix, to wordlines of a memory array having a plurality columns and rows of memory cells, each row of the memory cells being associated with a respective one of the wordlines;

storing in the memory array, column-by-column of the memory array, a set of data corresponding to a respective one of the sets of input signals applied to the wordlines; and reading from the memory array, row-by-row of the memory array, the elements written to the memory cells.

17. The method of claim 16, wherein each of the memory cells comprises a ferroelectric field-effect transistor (FeFET) having a gate, a source and a drain, wherein the storing in the memory cells of each column comprises applying the respective set of input signals to the gates of the FeFETs in the column via the wordlines, and wherein the reading from each row of the memory array comprises receiving the elements written to the memory cells from the drains of the respect row.

18. The method of claim 17, wherein the storing in the memory cells of each column further comprises applying a voltage of a first level to all sources of the FeFETs, applying a voltage of a second level to the drains of the FeFETs in the column, and applying a voltage of the first level to the remaining columns of the memory array.

19. The method of claim 17, wherein the reading of elements from each row further comprises applying a voltage of a first level to all gates of the FeFETs, applying a voltage of the first level to the drains of the FeFETs in the row, and applying a voltage of a second level to the remaining rows of the memory array.

20. The method of claim 16, further comprising:

sequentially applying a plurality of sets of input signals, each set indicative of a respective column or row of values of elements of a second matrix, to wordlines of a second memory array having a plurality columns and rows of memory cells, each row of the memory cells being associated with a respective one of the wordlines;

storing in the memory cells in each column of the second memory array a set of data corresponding to a respective one of the sets of input signals applied to the wordlines; and forming a matrix of multi-bit elements, each of the multi-bit elements being a combination of the respective elements read from the two matrices.

\* \* \* \* \*

UNITED STATES PATENT AND TRADEMARK OFFICE
CERTIFICATE OF CORRECTION

PATENT NO. : 11,264,073 B2  
APPLICATION NO. : 17/085361  
DATED : March 1, 2022  
INVENTOR(S) : Shih-Lien Linus Lu It is certified that error appears in the above-identified patent and that said Letters Patent is hereby corrected as shown below:

In the Specification

Column 3, Line 37: Delete "M[4*i+j]," and insert --M[4*i+j], . . . ,--

Column 3, Line 56: "word-line" should read --wordline--

Column 4, Line 61: "word lines" should read --wordlines--

Column 5, Line 8: "word lines" should read --wordlines--

Column 5, Lines 14 and 15: "word lines" should read --wordlines--

Column 5, Line 16: "word lines" should read --wordlines--

Column 5, Line 18: "word lines" should read --wordlines--

Column 5, Line 55: "word lines" should read --wordlines--

Column 7, Line 33: Delete "an a" and insert --an--

In the Claims

Column 8, Line 66: In Claim 2, delete "a-rows" and insert --rows--

Column 9, Line 4: In Claim 3, "ferro-electric" should read --ferroelectric--

Column 9, Line 7: In Claim 4, "ferro-electric" should read --ferroelectric--

Column 10, Line 49: In Claim 12, delete "in of" and insert --in--

Signed and Sealed this  
Thirty-first Day of May, 2022

Katherine Kelly Vidal  
*Director of the United States Patent and Trademark Office*

Column 10, Line 52: In Claim 13, "single bit" should read --single-bit--

Column 10, Line 53: In Claim 13, "ferro-electric" should read --ferroelectric--